United States Patent [19]

Ahlgren

[11] 3,786,488

[45] Jan. 15, 1974

[54] ALGEBRAIC SUMMING DIGITAL-TO-ANALOG CONVERTER

[75] Inventor: Joseph Robert Ahlgren, Rockford, Ill.

[73] Assignee: Woodward Governor Company, Rockford, Ill.

[22] Filed: Dec. 30, 1971

[21] Appl. No.: 214,162

[52] U.S. Cl... 340/347 DA, 235/92 EV, 235/92 FQ, 235/92 PE

[51] Int. Cl. .......................... G06f 7/385, H03k 13/02

[58] Field of Search..................... 235/92 PE, 92 EV, 235/92 R, 92 FQ; 340/347 DA

[56] References Cited

UNITED STATES PATENTS

| | | | |
|---|---|---|---|
| 3,646,545 | 2/1972 | Naydan et al. | 340/347 DA |
| 3,651,414 | 3/1972 | Jamieson | 235/92 PE |
| 3,496,562 | 2/1970 | Smith | 235/92 EV |
| 3,678,252 | 7/1972 | Payne | 235/92 EV |
| 3,624,649 | 11/1971 | Ranieri | 235/92 EV |
| 3,305,858 | 3/1964 | King | 340/347 DA |

*Primary Examiner*—Thomas J. Sloyan
*Attorney*—C. Frederick Leydig et al.

[57] ABSTRACT

A signal conversion circuit in which there is developed an output signal having analog characteristics which vary with the algebraic sum of the numerical values represented by a plurality of changeable binary coded input signals. The loading of a binary up-down counter is controlled by a multiplexing switching unit so that the counter is preset consecutively to the numerical values of the successive input signals while being driven at a high counting rate in a direction and for a period corresponding respectively to the sense and value of the respective input signals. The operative state of the counter is effectively monitored to produce an output signal having a period which varies linearly with the algebraic sum of the input signals. In an alternate embodiment an output signal is produced which has a DC energy content proportional to the binary magnitude of a single input signal.

17 Claims, 3 Drawing Figures

ALGEBRAIC SUMMING DIGITAL-TO-ANALOG CONVERTER

This invention relates to a signal conversion circuits in general, and more particularly concerns digital-to-anglog conversion circuits.

The widespread use of digital computers and the availability of economical digital circuit elements in recent years have given rise to a wide proliferation of new digital control circuits for performing functions previously accomplished solely by analog signal techniques. For example, a copending application of William J. Barrett entitled Digital Governor, Ser. No. 177,285, filed Sept. 2, 1971 discloses speed governing apparatus for prime movers which is entirely digital in design and operation and which may advantageously replace many conventional electrical or electromechanical speed governing devices of the past. In the apparatus disclosed therein an actuator for controlling the energy flow to a prime mover receives an analog control signal which represents the combined effect of a plurality of binary coded digital control signals. While true arithmetic circuits for adding and subtracting binary numbers, with conventional means for digital-to-analog conversion, might have been used for the signal conversion interface in the above-mentioned application, the signal conversion circuit of the present invention has proven to be more flexible and economical both in design and in cost than the circuits previously existing for this purpose.

It is a principal object of the present invention to provide a circuit which combines the function of algebraically summing digital signals with the function of converting digital signals to an analog form of intelligence.

It is another object of the present invention to provide a signal conversion circuit in which an analog output signal is developed having a period corresponding to the algebraic sum of a plurality of binary coded input signals. It is a related and more specific object to provide a digital-to-analog conversion circuit in which a binary up-down counter is employed and controlled to consecutively monitor a plurality of digital input signals and to count in a direction and for a period corresponding respectively to the sense and binary magnitude of each of said input signals, with the advantage that the time interval required for completing the sequence of monitoring each input signal and counting up or down for periods corresponding to the binary magnitude of these signals is linearly related to the algebraic sum of the numbers represented by the respective signals.

It is a further object of the present invention to provide a digital-to-analog converter which continuously monitors a plurality of binary input signals presented to the converter in parallel fashion and which produces an alternating output signal having frequency or period characteristics related to the sum of the input signals.

Still another object of the present invention is the provision of a conversion circuit for receiving a digital input number in a parallel-bit fashion and for producing an output pulse train in which the duty cycle or DC energy content is proportional to the binary magnitude of the input signal.

Other objects and advantages of the invention will become apparent upon reading the following detailed description and upon reference to the drawings, in which.

Figure 1:
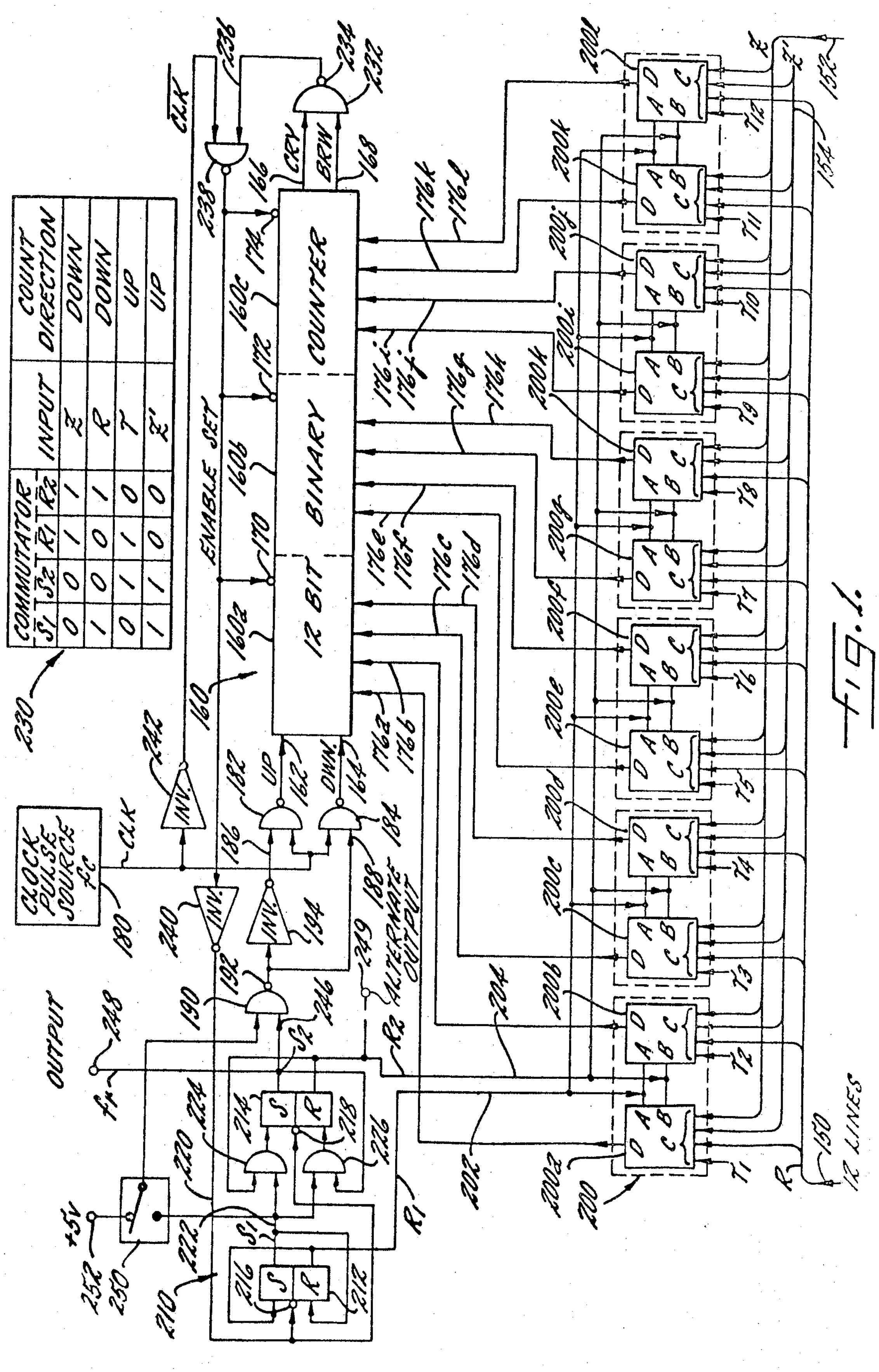
FIG. 1 is a block diagram of a signal conversion circuit constructed in accordance with the present invention.

While the invention has been shown and will be described in some detail with reference to a preferred embodiment thereof, there is no intention that it thus be limited to such detail. On the contrary, it is intended here to cover all modification and equivalents falling within the spirit and scope of the invention as defined by the appended claims.

As used herein, the term "signal" is to be taken in a generic sense and is intended to include any electrical manifestation having information content. Thus a "signal" may be a voltage or current carried by two lines or it may be the parallel combination of binary bits presented simultaneously on a plurality of lines equal to the number of bits. In the former case, the "magnitude of the signal" is measured in terms of current, voltage, frequency or period, whereas in the latter case the "magnitude of the signal" is measured by the binary number represented by the simultaneously occurring logic states on the parallel lines.

The term "squarewave" is used in a broad sense to denote a periodic wave which alternately assumes one of two fixed values, the time of transition being negligible in comparision with the duration of each fixed value.

The logic elements shown in connection with the following description typically operate between supply voltage levels of 0v. and 5v. and in the description to follow a logic "1" is assumed to be the 5v. level, while a logic "0" is the 0v. level.

In the circuit drawing digital circuit elements have been symbolically illustrated in the manner commonly used in the electronics art. In view of the widespread usage of certain elements, it is unnecessary to give a detailed description of the combination of components constituting each logic element, and it will be readily appreciated by one skilled in the art that many different variations and combinations of components can be used to perform the logic function assigned to each logic element. However, a brief description of the operation of the common elements shown in the drawings will be helpful in understanding the operation of the summing converter. A flip-flop is a two stage circuit having two stable states. In one state, the first stage conducts and the second stage is cut off. In the other state, the second stage conducts and the first stage is cut off. The flip-flops are illustrated as rectangles having a "set" section S and a "reset" section R. Input terminals are attached to the left side of the flip-flops as illustrated in the drawings, and output terminals are attached to the right side thereof. When an input signal or pulse is shown applied to a terminal connected to the junction of the S and R sections the element is intended to represent a "clocked" flip-flop, characterized by the fact that the stable state at the input of the S and R sections will be shifted to the outputs of the S and R sections respectively only upon the occurrence of a "clock" pulse at the junction terminal. A "clocked"

type flip-flop will act as a binary counter if the R output is connected to the S input and the S output is connected to the R input (commonly called the J-K configuration). With these cross connections, the flip-flop is "set" with each even numbered clock pulse at the clock terminal and "reset" with each odd numbered pulse at the clock terminal. In practice, a "set" flip-flop is said to be in the "1" state, with the S and R outputs being logic 1 and logic 0 respectively. A "reset" flip-flop is said to be in the "0" state, with the S and R outputs being logic 0 and logic 1 respectively. A circle at the clock terminal indicates that the lip-flop changes state on the falling edge of the clock pulse.

An "AND" gate produces a desired "1" output signal only in response to "1" level input signals at all of its input terminals simultaneously. When the desired output signal is a logic "0," the gates are termed NAND gates and are represented as AND Gates with a circle at the output terminals. An invertor (INV) converts a "1" level signal into a "0" level signal and vice versa. Finally, certain logic functions in the embodiments to be described, such as binary counting and multiplexing, may be performed by multi-function logic elements which have been standardized in the digital art and which are available in single-package integrated circuits. While these multi-function circuits are characteristically combinations of simple flip-flops and gates, their operation is better understood by reference to their overall function and input-output characteristics. Thus the detailed description of the internal construction of these elements is incorporated by reference to the manufacturer and his assigned type number for the element.

Turning now to FIG. 1, the conversion circuit receives a plurality of sets of binary coded input signals R, Z and Z′ or 12-wire harnesses 150, 152 and 154 respectively. The number of input lines or wires used in each set of input lines, i.e., each harness will correspond to the number of bits in each set of the input signals, which in the present instance is. Thus, in the present example there is a plurality of three sets of input signals R, Z and Z′ (plus a fourth set T, discussed below), and each set includes a plurality of 12 individual bit signals. Each set represents a number whose value which may change from time-to-time as the individual signals within that set change, and the numbers are here simply called R, Z and Z′. A multi-stage synchronous up-down counter 160 having first (UP) and second (DOWN) count-direction control terminals 162, 164 is provided as the principal operating element in the system. The counter 160 includes a carry (CRY) output 166, a borrow (BRW) output 168, set-enabling inputs 170, 172, 174 and a plurality of bit input lines, 176*a*–1761, one for each stage of the counter, for presetting the counter to a predetermined binary number in response to a set-enabling pulse at the terminals 170, 172, 174. The CRY output 166, normally at logic "1," goes to logic "0" only when the counter 160 has assumed the all 1's condition and the pulse at the up-count input 162 goes low. Similarly, the BRW output 168, normally at logic "1," goes to logic "0" only when the counter 160 has assumed the all 0's condition and the pulse at the down-count input 164 goes low.

The 12-bit counter is shown divided into three sections 160*a*, 160*b*, 160*c* since, in actual practice, it consists of three four-bit counters connected in tandem, the CRY and BRW outputs of each connected respectively to the up and down-count inputs of the succeeding section and each section typically being type SN74193 manufactured by Texas Instruments and more specifically described in T1 Catalog Supplement CC301 dated 15 Mar. 1970. For selectively driving the counter up or down there is provided a source 180 of the clock pulses CLK at a stable high frequency $f_c$ the magnitude of which is partially determinative of the resolution achievable in the signal conversion operation. The clock pulses CLK are selectively coupled to the up-command input 162 or down-command input 164 via one or the other of a pair of direction controlling NAND gates 182, 184. Inputs 186, 188 to the gates 182, 184 are controlled by a single NAND gate 190 having an output 192 which is logic "0" during counting up and logic "1" during counting down. An inverter 194 inverts the state of the output 192 for application to the control terminal 186 of the gate 182.

In accordance with the present invention the reversible counter 160 is controlled by a logic circuit interposed between the binary coded input signals R, Z, A′ and the counter 160. The logic circuit in general provides the functions of presetting the counter in successive steps to the binary magnitude of each of the input signals R, Z and Z′ and controlling the counter during the intervals between presetting to count up or down to the maximum or minimum count depending upon the sense of the input signal to the magnitude of which the counter was last preset. Additionally, the logic circuit has means associated therewith for producing an output pulse when the counter has finished counting to its maximum or minimum count from all of the input signals R, Z and Z′, the attendant results being that successive output pulses occur at intervals which vary linearly with changes in the algebraic sum of several the binary coded input signals.

More specifically, the logic circuit includes gating means in the form of a digital multiplexer for sequentially applying the input signals R, Z and Z′ to preset the counter and a commutating device which responds to the maximum or minimum count in the counter 160 by toggling to its next operative state, thereby commanding the counter 160 to count in a predetermined direction from the binary value of the input number to which the counter was last preset.

As shown in FIG. 1, the gating means, indicated generally at 200, selectively conveys the binary information in the inputs R, Z and Z′ to the load lines 176*a*–176*i* of the counter 160. The gating is accomplished by a series of multiplexers 200*a*–200*l*, each having a controlled terminal D connected to a respective one of the load lines 176*a*–176*l* of the counter 160, a plurality of input terminals C for receiving one digit from each of the binary coded input signals, and control terminals A and B for receiving a binary coded control signal. The multiplexers are logic devices typically of type SN74153 manufactured by Texas Instruments and described more fully in the catalog CC301 cited above. They are shown grouped together in two's to illustrate the fact that they are so grouped together by the manufacturer in a single integrated circuit. Where only inputs R and Z are applied to the multiplexers, it will be readily understood that only two inputs for loading the binary counter need be controlled, which could be facilitated by replacing the multiplexers 200*a*–200*l* with gates acting as simple single pole-double throw switches. However, the embodiment shown has three inputs R, Z and Z' algebraically combined, in which case the expanded multiplexer arrangement of FIG. 1 becomes desirable. A fourth unused input T1–T12 to the multiplexer units may be used but, as shown, it is left disconnected. The control inputs A and B to each multiplexer are connected to common control lines 202, 204, respectively. Each of the input lines C to a given multiplexer has a binary two-bit address associated therewith, and application of that binary address to the control terminals A, B gates the proper one of the inputs C to the controlled terminal D. Since all A and B control terminals receive a common binary command, all 12 multiplex units will pass their respective digits of the input number having an address or index corresponding to that binary command to the counter at the same time.

The commutating device, indicated generally at 210, is comprised of two flip-flops 212, 214 connected to form a two-stage synchronous counter which will be recognized as constituting a multi-state device, in this example having four possible count states. Each flip-flop is in the J-K configuration and has a clock terminal, 216 and 218 respectively, tied to a commutator drive line 220. A connection 222 from the $S_1$ output terminal of the flip-flop 212 is applied to a pair of AND gates 224, 226 to inhibit the criss-crossing feedback around the flip-flop 214 whenever the $S_1$ output from the flip-flop 212 is low, thereby preventing the clock pulse at the terminal 218 from effecting a change of state of the flip-flop 214. The four possible logic states of the commutator 210 determine a) the direction of counting, b) the input number to be gated through the multiplexers 200, and c) the logic level of the output signal. The interrelation between these factors is illustrated in the truth table 230. The commutating sequence is repeated with every fourth pulse on the line 220, and the multiplexers sequentially apply the respective input signals R, T, Z', Z to set the counter 160. For driving the commutator 210 and for producing loading of the counter, a NAND gate 232 is provided to receive the carry (CRY) and borrow (BRW) outputs 166, 168 from the counter 160. An output terminal 234 from the NAND gate 232 drives an input 236 of a second NAND gate 238, the other input of which receives the complement $\overline{CLK}$ of the clock input signal CLK. The output signal from the NAND gate 238 controls the set-enabling inputs 170, 172, 174 of the counter 160. Additionally, the output of the NAND gate 238 is applied to an inverter 240, the output of which is connected to the commutator drive line 220 connected to the clock terminals 216, 218 of the commutator 210. An inverter 242 supplies the complement signal $\overline{CLK}$ for the gate 238 by inverting the clock signal CLK.

To facilitate control of the counter 160 from the commutator 210 the $S_2$ output of the flip-flop 214 is connected via a line 246 to one input of the NAND gate 190 which controls the direction of counting. In the embodiment shown, the $S_2$ output provides a monitoring point for the main output terminal 248 for the conversion circuit. It will be understood, however, that the output signal from the circuit could additionally be taken from the R output (designated the ALTERNATE OUTPUT 249 in FIG. 1), since the frequency and period of the signal at each of these points is the same. The other input terminal to the NAND gate 190 is normally connected through a single pole-double throw switch 250 to a positive voltage source 252. Alternatively, the switch 250 may connect the second input of the NAND gate 190 to the S output of the flip-flop 212 to reverse the sense or polarity of the unused input number T (connected to terminals $T_1$–$T_{12}$ of multiplexer) in the algebraic summing function. With the switch 250 in the position shown, the operational states of the circuit are as indicated in the table 230. The counter 160 counts down during the first and second operational states of the commutator sequence, in which the $R_1$, $R_2$ logic states are 1, 1 and 0,1. The counter 160 counts up during the third and fourth operational states of the commutator 210, in which the $R_1$, $R_2$ states are 1,0 and 0,0 respectively.

At this point it is noted that succeeding input numbers are loaded into the counter 160 immediately before the commutator 210 changes states, so that the index numbers at terminals A, B of the multiplexers **200*a*–200*l* which gate the respective inputs to the counter 160 correspond to the $R_1$, $R_2$ states existing during the previous commutator state shown in table 230. For example, the input number R is gated through the multiplexers 200*a*–200*l* during the entire commutator state in which $R_1, R_2 = 1,1$, although the number R is not loaded into the counter 160 until immediately before the commutator 210 changes to the state in which $R_1, R_2 = 0,1$. With this in mind, it should be apparent that the multiplexer indexes given to positive sense input numbers, such as Z and R in the present example, are 0,0 or 1,1. Such an assignment of index numbers for the multiplexer control terminals A, B in the present instance allows both numbers Z and R to be fed into the counter 160 immediately before a period of counting down begins. As noted previously, if the T input to the counter is used, it can be added positively or negatively by having the switch 250** in its lower or upper position respectively.

Figure 2:
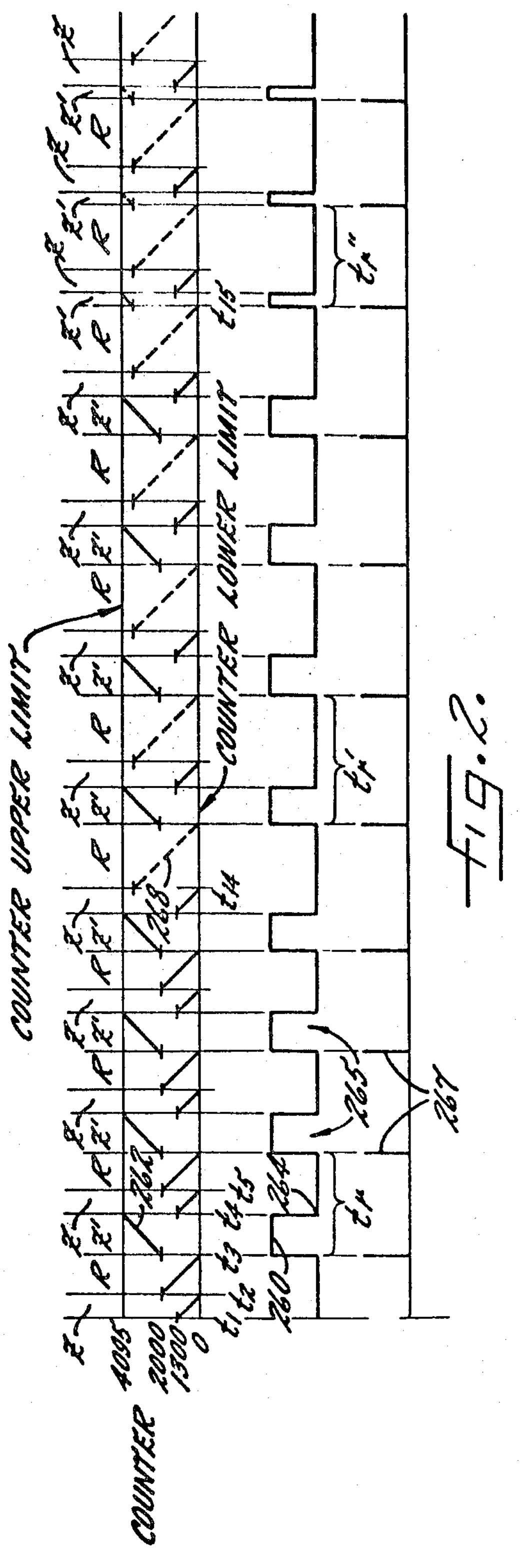
FIG. 2 is a graph showing several system variables to illustrate the principal mode of operation for the circuit shown in FIG. 1.

The operation of the conversion circuit using three inputs Z, R and Z' is illustrated in FIG. 2, in which the count in the counter 160, the final output at terminal 248 and the leading edges of the output pulses are plotted against a common time base. Basically, algebraic summation is accomplished by making the counter 160 count up to a predetermined maximum count from the set-in values of the negative-sense binary input numbers and making it count down to a predetermined minimum count from the set-in values of the positive-sense input numbers. With an output pulse produced during each commutation cycle through all of the input numbers, the period of the output signal varies linearly with the algebraic sum of the binary coded input numbers. In the example illustrated in the timing diagram of FIG. 2 the inputs R, Z and Z' are binary equivalents of 1,300; 2,000 and 2,000 respectively, and the signs of these numbers are +, + and − respectively. The binary indexes A, B in the multiplexers **200*a*–200*l* for the inputs Z, Z' and R are respectively 0,0; 1,0 and 1,1, these being the binary state signals appearing on lines R1, R2.**

To facilitate an understanding of the operational sequence, assume that at the instant $t_1$ the number Z has been loaded into the counter 160 and the commutator 210 has assumed the operative state in which $R_1,R_2 = 1,1$. The output at the terminal 248 is necessarily at a low voltage (since $S_2 = 0$), and the output 192 from the gate 190 is high, in which case the clock pulses CLK are gated through the gate 184 to the down-count input 164 of the counter 160. Beginning at instant $t_1$, the counter counts down at a rate determined by the frequency $f_c$ of the clock signal CLK. Eventually the counter 160 achieves its minimum count (all 0's). At this point it should be noted again that the counter 160 is characterized in that the count changes on the positive-going edge of the clock pulse at the down-count input 164 and that the BRW output 168 goes low only after the clock pulse at the down-count input 164 goes low (and, of course, the counter is in the all 0's condition). Similarly, the CRY output 166 goes low only after the pulse at the up-count input 162 goes low (and the counter is in the all 1's condition). Therefore, after the all 0's condition is achieved and the down-count input 164 goes low, the BRW output goes low, and the output 234 from the gate 232 goes high. At this time, however, the signal $\overline{CLK}$ is low at the input to the gate 238 and the enable-set line remains at its normal high voltage. Then, as the signal CLK goes low again and the signal $\overline{CLK}$ goes high, another positive-going pulse occurs at the down-count input 164 to the counter 160 and the counter begins to change counts. However, the BRW output 168 remains low and the input 236 to the gate 238 remains high for a period of approximately 50–75 nanoseconds resulting from the inherent propogation delay of the counter 160. During this brief period both inputs to the gate 238 are high, so that a low voltage appears on the enable-set line to load the counter 160 with the number then present on the counter load input lines 176*a*–176*l*. The $R_1$,$R_2$ outputs at this time are 1,1, which is the binary control index for the input number R in the multiplexers 200*a*–200*l*. Thus the counter 160 is set to the number R. At the end of the brief propogation delay in the counter 160, the BRW output 168 goes high again, causing the input 236 to the gate 238 to go low. The enable-set voltage goes high, creating a negative-going voltage change at the clock terminals 216, 218 of the commutator 210 which causes the commutator 210 to change to its next logic state ($R_1$,$R_2$ = 0,1) at instant $t_2$. Thereafter the $S_2$ output (and the output at terminal 248) is low, the input 188 to the gate 184 is high, and clock pulses are gated to the down-count input 164 of the counter. The counter again counts down, this time from the number R, to the all 0's condition, after which the counter is again preset and the operative state of the commutator 210 changes at instant $t_3$.

In the exemplary illustration of FIG. 2, is intended that the T input shown in FIG. 1 be unused. To effect operation in this manner the T input terminals $T_1$–$T_{12}$ are tied to logic "1." During the commutator state in which the $R_1$, $R_2$ outputs are 0,1, the number T (all 1's) is gated through the multiplexers 200*a*–200*l*. Thus, when the counter 160 has completed counting down to the all 0's condition from the number R, the counter 160 is preset with the number T to the all 1's condition, after which the commutator 210 is toggled to the state in which $R_1$, $R_2$ = 1,0 and the counter begins to count up. However, during the first cycle of the CLK signal at the up-count input 162 of the counter 160, the CRY output 166 is activated, which results in the loading of the input number Z' (with a binary index 1,0), and toggling of the commutator 210 to the state in which $R_1$, $R_2$ is 0,0. In effect, the $R_1$, $R_2$ signal state 1,0 is bypassed in that the time required to pass through this state is extremely brief when compared to the time duration of the total commutation cycle. In other words, the value of the numerical signal T is essentially zero in the algebraic summation.

With the $R_1$, $R_2$ state at 0,0 the output at terminal 248 is high, as indicated at 260. Beginning at the instant $T_3$, the counter begins to count up (at 262) until it reaches its upper limit (all 1's) at the instant $t_4$. Thereafter the CRY output 166 goes low, the input number Z is loaded into the counter, and the commutator 210 is toggled to the state in which $R_1$, $R_2$ = 1,1. The output signal at the terminal 248 goes low as indicated at 264 and the counter 160 begins counting down to initiate the next cycle of the commutator 210. Thus one full commutation cycle is completed between the instants $t_1$ and $t_4$, and the cycle continuously repeats itself. There is one output signal manifestation, here the positive-going voltage transistion from level 264 to level 260 shown in FIG. 2, during each commutation cycle.

The output wave 265 taken from the commutator $S_2$ terminal has high values only when the commutator 210 makes the $R_1$, $R_2$ signal 0,0 or 1,0. Thus, the durations of the low and high values of the output pulses are respectively (a) proportional to the sum of the positive sign input numbers and (b) inversely related to the sum of the negative sign input numbers because the larger such numbers become, the shorter are the counting up periods In the latter relationship (and as shown by FIG. 2), the counting up interval determined by the negative-sense input number Z' is proportional to (M–Z'), where M is the full count (here decimally 4095) capacity of the counter 160. Thus the period $t_r$ of the output wave is $$t_r = (Z/f_c) + (R/f_c) + (M - Z')/f_c$$

where $f_c$ is the CLK frequency. The period $t_r$ thus increases as positive input numbers such as Z and R increase, and it decreases as negative input numbers such as Z' increase. The constant M is, in effect, a bias which decreases the sensitivity or resolution of the period $t_r$ in response to changes of a given magnitude in any of the input numbers. The output frequency and period from the signal conversion circuit may be expressed:

$$f_r = (f_c/R + Z - Z' + M)$$

$$t_r = (R + Z - Z' + M/f_c)$$

From the foregoing, it may be seen that any negative input, such as the number T mentioned above, may be rendered ineffective or removed by setting that number equal to M, so that the quantity (m–T) which would normally be a part of the foregoing expressions, becomes zero. To render any positive sign input ineffective, the number or input is made equal to zero, so that its down counting periods are essentially of zero duration, i.e. endure for only one CLK pulse.

The effect of changes in the input numbers R and Z' on the reference period $t_r$ is shown in FIG. 2. At the instant $t_{14}$ an increase occurs in the number R (a positive sense number) as indicated by the broken line 268. The result is a corresponding increase in the period $t_r$, to the value $t_r'$. At the instant $t_{15}$, the negative-sense number Z' increases. The result is a corresponding decrease in the period $t_r$, as reflected in the period $t_r''$. It is seen, therefore, that the period $t_r$ varies linearly (and the frequency $f_r$ varies inversely) with the algebraic sum of the inputs R, Z and Z' to the signal conversion circuit. Unipolar differentiation of the pulse train 265 will produce the pulses 267 for applications where such a signal is desirable.

It will be appreciated that numerous changes may be made in the circuit shown in FIG. 1 without changing the basic character of the circuit as a digital-to-analog converter. For instance, the number of inputs can be decreased or increased by respectively decreasing or increasing the capacity of the multiplexer 200 and the multi-state commutator 210. The speed at which the frequency and period of the reference signal $f_r$ changes in response to changes in any of the binary input numbers is directly related to the frequency $f_c$ of the clock signal CLK and is limited only by the upper limit of the frequencies at which the counter and other logic elements can operate. But once a stable clock frequency is chosen, the output frequency $f_r$ and the period $t_r$ depend essentially upon only the instantaneous absolute value of the algebraic sum of the changing input numbers such as R, Z and Z'.

AN ALTERNATE MODE OF OPERATION

In the description given thus far, the conversion circuit of the present invention has been described as generating an analog signal whose period and frequency vary with the magnitude of digital input signals. It is often desirable in D to A converters to have other parameters of the output signal, particularly the DC magnitude, vary in accordance with the changing value of the digital input number.

Therefore, as a further feature of the present invention the conversion circuit of FIG. 1 is useful for a more widely used form of digital-to-analog conversion, namely for conversion of the binary magnitude of a single digital input number into a signal whose DC content or average value varies according to changes in that binary magnitude. In this alternate mode of operation the inputs T and R are first made ineffective in the manner described above, namely by setting T to the maximum count of the counter 160 and setting R to the minimum count of the counter 160. The time required for the commutator 210 to cycle through the two unused states ($R_1$, $R_2$ = 0,1 and 1,0) will be negligible when compared to the count time for the active inputs states 0,0 and 1,1 of table 230. Next, the active inputs Z and Z' are tied together, bit by bit, so that the same input number, Z for example, is loaded into the counter before each of the active states $R_1, R_2 = 0,0$ and 1,1). The output signal is taken from the ALTERNATE OUTPUT terminal 249 (FIG. 1) in this mode of operation.

Figure 3:
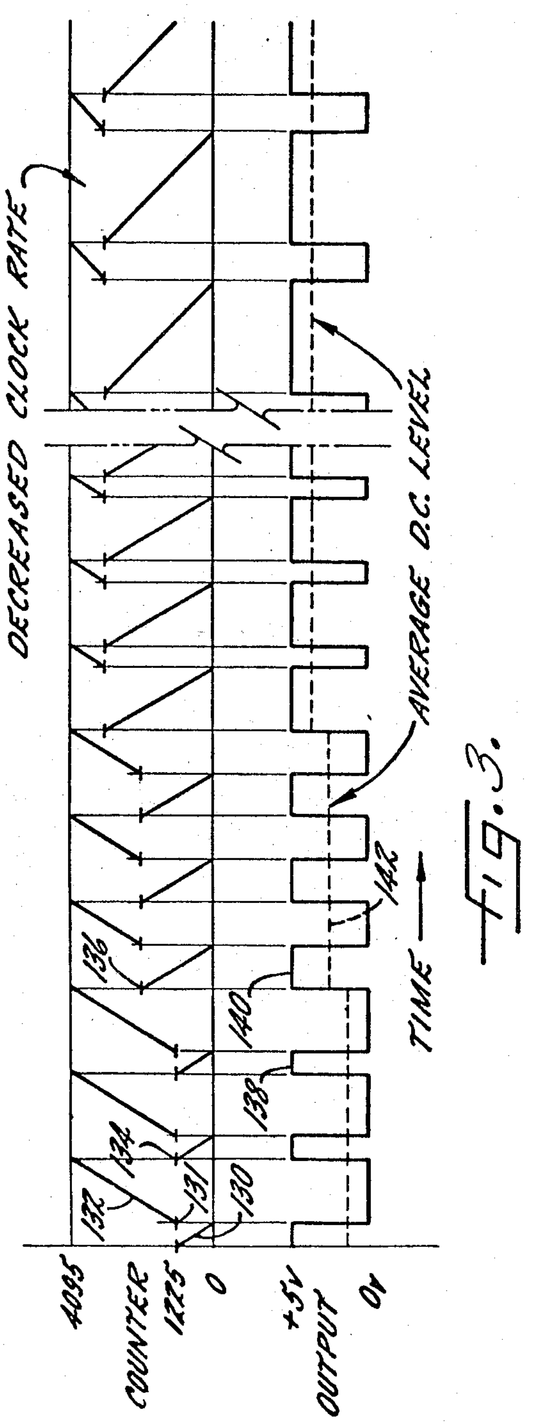
FIG. 3 is a graph illustrating an alternate mode of operation for the circuit of FIG. 1, and in which the output signal has a DC voltage level proportional to the value of a digital input signal.

The operation of the digital-to-analog converter in the alternate mode is illustrated in FIG. 3, in which the instantaneous count in the counter 160 is shown on a common time base with the output signal at the terminal 249. The DC energy level of the output signal is shown superimposed on the signal itself. For the operational example shown, the number Z loaded into the counter 160 is initially the binary number 010011001001 representing 1225 in the decimal system. The commutator outputs $R_1$, $R_2$ are initially 1,1 so that the NAND gate 184 controlling the down-count input 164 of the counter 160 is enabled. As shown at 130, the instantaneous value of the count in the counter 160 decreases until the all 0's condition is reached in the counter 160. Thereafter, in the manner described above, the BRW output 168 goes low, causing the output 234 from the NAND gate 232 to go high. When the signal $\overline{CLK}$ goes high, the voltage on the enable-set line goes low to cause the counter 160 to be preset to the input number prevailing on the lines 176a–176 l. Since the R and T inputs are disabled, the commutator 210 will rapidly step through its corresponding states in the table 230 on successive pulses CLK until the last state ($R_1$, $R_2$ = 0,0) is reached, at which time the input number Z' (equal to the number Z in this instance) as allowed to preset the counter 160, as indicated at 131 of FIG. 3. Immediately thereafter the logic circuit, and particularly the flip-flop 214, changes to the state in which the output $S_2$ is high. As a result, the succeeding clock pulses CLK pass through the gate 182 to the count-up input 162 of the counter 160, and the count state increases, as shown at 132. The counter counts up to its maximum (all 1's), at which time the CRY output 166 goes low to initiate a new cycle by loading the counter with the instantaneous value of the input number Z and changing the state of the commutator 210 of the logic circuit. As shown at 134, the counter counts down to begin the cycle all over again.

Therefore it can be seen that in the alternate mode of operation the commutating logic circuit has two principal states of operation ($R_1$,$R_2$ = 0,0 and 1,1) and that the commutating logic alternately commands the counter 160 to count up and down to its maximum and minimum capacity respectively from the same input number Z. As a result, the output voltage level at terminal 249, which reflects the state of the commutator 210, alternates between first and second voltage levels and has a duty cycle and average value which are directly proportional to the binary magnitude of the input number Z. As the number Z increases, the time needed for counting up decreases, and the time for counting down increases. Since the output at 249 is high during counting down and low during counting up, the duty cycle increases in direct proportion, i.e., linearly, to the increase in the number Z. An example of this is shown at 136 in FIG. 3.

Since the clock frequency remains the same, the sum of the times required for the counter to count down to 0 from the number Z and to count up from the number Z to a full count does not change as the number Z varies. Thus the frequency at which the commutator 210 is reset remains the same when the number Z varies. However, the width of the pulses 138, 140 taken from the $S_2$ terminal of the flip-flop 214 changes, and the DC content 142 of these pulses changes according to the variations in the input number Z. As a result, the DC magnitude of the output signal at the terminal 249 is directly proportional to the binary number Z, if one assumes (as shown in the example of FIG. 3) that the ouput terminal 249 resides at zero volts potential during times when the pulses 238 or 240 are absent.

One of the primary features of this converter lies in its insensitivity to changes in the clock frequency, as illustrated in the right hand portion of FIG. 3. The decreased clock rate lengthens the time during which the counter must count to reach its limit, but the relative duration of the up and down count periods, and hence the DC level of the output, is not affected. That is, the "duty cycle" of the squarewave at terminal 249 is unaffected by the long-term changes in the frequency of the clock pulses CLK, even though the frequency of the squarewave output may vary.

It will be apparent to one skilled in the art that in the alternate mode of operation described above the counter 160 is controlled by a logic circuit which has two principal states of operation, namely, a first state in which counting up occurs and a second state in which counting down occurs. Included in this logic circuit are the direction counting gates 182 and 184, which can be seen to constitute means for causing the counter to count up or down respectively in response to the logic circuit residing in its first or second states. Additionally the logic circuit controlling the counter 160 includes the gates 232 and 236 which, along with the signals combined in these gates, constitutes a means for repetitively presetting the counter to the prevailing input number in response to the counter reaching a predetermined maximum or minimum count. In association with the flip-flop 214 of the commutator 210, the gates 232 and 238 additionally constitute a means by which the logic circuit is driven to its second operational state in response to the counter achieving its maximum count and a means by which the logic circuit is driven to its first operation state in response to the counter achieving its minimum count. Finally, it can be seen that the flip-flop 214 via the output terminal 249 constitutes a means for producing a squarewave output signal which has first and second voltage levels when the logic circuit resides respectively in its first and second states, so that the output signal has a duty cycle and average value which varies dynamically according to changes in the input number.

It should also be appreciated by one skilled in the art that the alternate mode of operation just described can be accomplished with a substantial simplification in the circuit shown in FIG. 1. Specifically, the flip-flop 212 of the commutator 210 and the entire multiplexing gate circuit 200 can be omitted without affecting circuit operation in the alternate mode. Terminals can be provided to allow for direct connection of the input number at the lines **176*a*–176*l* feeding the binary counter 160.**

Being simplified as described above, the commutator 210, now constituting the single flip-flop 214, merely controls the direction of counting by enabling one or the other of the gates 182 and 184 in response to the achievement respectively of the minimum and maximum counts in the counter 160. Of course, the flip-flop 214 still provides, via the terminal 249, an output signal, the DC content of which varies according to changes in the numerical magnitude of the input number at the lines **176*a*–176*l*.**

In summary, it is seen from the foregoing description that there has been brought to the art a conversion circuit having two principal modes of operation. In the first mode the circuit at the same time performs both the function of algebraically summing a plurality of dynamically changeable digital input signals and the function of converting the digital sum to an analog output signal having a period which varies linearly and substantially instantaneously with changes the sum of the changeable input numbers. In the second or alternate mode, a single dynamically changeable digital input signal is converted to an analog output signal in the form of a squarewave having a duty cycle or DC content which varies substantially instantaneously according to changes in the numerical magnitude of the digital input signal.

I claim:

1. A signal conversion circuit comprising, in combination a. means for signaling a plurality of sets of changeable multi-bit digital representations, with each set respectively representing one of a corresponding plurality of changeable numbers;

b. a presettable counter, continously driven to count at a predetermined rate and which counts from any numerical value preset therein;

c. means responsive to the counter reaching one of (a) a predetermined minimum count state and (b) a predetermined maximum count state for presetting one of said sets of digital representations into the counter;

c1. said last-named means including means to preset all of said sets successively and in turn into the counter so that successive counting intervals are measured off which are respectively related to the changeable values of said numbers;

d. means for controlling the direction of counting by said counter after each presetting according to the sign assigned to the changeable number represented by the set of representations last preset into the counter, and e. means for producing an output signal each time that all of the plurality of sets of representations have been preset into the counter, whereby the period of said output signal varies substantially linearly with changes in the algebraic sum of all of the represented changeable numbers.

2. The combination set forth in claim 1 further characterized in that said means (c) and (c1) include a multi-state device having a number of states equal to the quantity of sets in said plurality of sets, means for advancing said device from one of its states to the next in response to the counter reaching one of said predetermined minimum and maximum count states, and means controlled by said device to preset a particular one of said sets into the counter corresponding to the then-existing state of said device.

3. The combination set forth in claim 2 further characterized in that said means (e) includes means for producing an output signal manifestation each time said multi-state device cycles through all of its states and enters a particular one of its states.

4. The combination set forth in claim 2 further characterized in that a plurality of gates are interposed between said signaling means (a) and presetting inputs to said counter, and further including means responsive to each state of said multi-state device for opening said gates to transmit to said presetting inputs a corresponding one of said sets of digital representations.

5. The combination set forth in claim 2 further characterized in that said counter is controllable to count in either an upward or downard direction, and at least one of said changeable numbers is assigned a positive sense while at least one is assigned a negative sense, and wherein said means (d) includes means controlled by said device according to its state to cause said counter to count down after any positive sense number, and to count up after any negative sense number, has been preset into said counter.

6. An algebraic summing digital-to-frequency converter comprising, in combination, a. a source of recurring pulses having a predetermined frequency;

b. an up-down counter coupled to receive said pulses;

c. means for signaling on a plurality of sets of input lines multi-bit signals which respectively digitally represent the magnitudes of a corresponding plurality of numbers each of which is assigned a positive or negative sense;

d. a multi-state device capable of residing in any of a plurality of states each of which corresponds to one of said numbers;

e. means responsive to said counter reaching a predetermined maximum and a predetermined minimum count for advancing said device from one state to the next;

f. means responsive to said device being advanced from one state to the next for presetting into said counter that set of multi-bit signals which corresponds to said next state;

g. means responsive to the said device for causing said counter to count said pulses upwardly or downwardly according to the assigned negative or positive sense of the number which corresponds to the state in which said device is residing, and h. means associated with said device for producing an output signal which has one cycle each time the device passes through all of its states, whereby the frequency of said output signal varies substantially in an inverse linear relation according to changes in the algebraic sum of all of said numbers.

7. A signal conversion circuit comprising multiple sets of input lines for simultaneously receiving a plurality of sets of input signals digitally representing the then-existing values of a plurality of numbers each of which may change in value from time-to-time;

means including a logic circuit connected to said sets of input lines so as to receive said input signals and a continuously driven up-down counter controlled by said logic circuit so as to be successively preset to the numerical value represented by each of said sets of input signals; said logic circuit further including means to control said counter during the interval between successive presettings to count up or down, depending upon the assigned sense of the last-preset input signal, from the numerical value to which the counter was last preset; and said logic circuit including means responsive to said counter reaching a predetermined upper or a predetermined lower count value for initiating the next presetting operation; and means associated with said logic circuit for producing an output signal manifestation each time when the counter has finished counting operations based upon all of said sets of input signals, said logic circuit being operative to repetitively cycle through said counting operations so that the period between said output manifestations varies substantially in accordance with hanges in the algebraic sum of the numbers digitally represented by said sets of input signals.

8. A signal conversion circuit in accordance with claim 7 wherein said logic circuit for controlling said counter includes means responsive to the achievement of either of the maximum and minimum counts in said counter for presetting said counter to the numerical value of the next set of input signals.

9. A signal conversion circuit in accordance with claim 7 wherein said counter has a plurality of loading terminals by which the up-down counter may be preset to a predetermined number and wherein said logic circuit for controlling the counter includes gating means connected to simultaneously receive said plurality of sets of input signals and adapted to sequentially couple the individual sets of input signals to said loading terminals.

10. A signal conversion circuit according to claim 9 wherein said logic circuit further includes a second counter having count states corresponding respectively to each of said sets of input signals and wherein said gating means is controlled by said second counter so as to connect to said loading terminals that set of input signals which corresponds to the prevailing count state of said second counter.

11. A signal conversion circuit according to claim 10 wherein said logic circuit further includes means responsive to the achievement of either one of maximum and minimum count states in said up-down counter for presetting said counter to the value represented by that set of input signals then on said loading terminals and for advancing said second counter to its next count state.

12. A signal conversion circuit in accordance with claim 10 wherein said up-down counter counts down during logic states of said second counter corresponding to positive-sense sets of input signals and counts up during logic states of said second counter corresponding to negative-sense sets of input signals.

13. A signal conversion circuit comprising multiple sets of input lines for simultaneously receiving a plurality of sets of input signals digitally representing the then-existing values of a plurality of numbers each of which may change in value from time-to-time;

means including a logic circuit connected to said sets of input lines so as to receive said sets of input signals and a continuously driven counter controlled by said logic circuit so as to be successively preset to the numerical value of each of said sets of input signals, said logic circuit further including means to control said counter during the intervals between presettings to count down to its minimum count from the numerical value of that set of the input signals to which the counter was last preset; and said logic circuit including means responsive to said counter reaching a predetermined low count value, which is no greater than the number representable by any of said sets of input signals, for initiating the next presetting operation; and means associated with said logic circuit for producing an output signal manifestation once each time the counter has been preset according to all of said sets of input signals, and means for causing said logic circuit to repetitively cycle through said presetting operations so that the time-spacing between said output manifestations varies substantially in accordance with changes in the sum of the numbers represented by all of said sets of input signals.

14. A signal conversion circuit comprising:

multiple sets of input lines for simultaneously receiving a plurality of sets of changeable input signals digitally representing the then-existing values of a plurality of numbers each of which may change from time-to-time;

a multi-stage counter continuously driven at a high counting rate in the up-count or down-count direction;

a commutating logic circuit associated with said counter and said sets of input lines and having a plurality of logic states each corresponding to one of the sets of digital input signals, said logic circuit including means responsive to the achievement of one of the maximum and minimum count states in said counter to a. preset the count in said counter to the numerical value represented by the set of input signals corresponding to the then-existing state of said logic circuit, b. toggle the logic circuit to its next logic state, and c. initiate counting in the up or down-counting direction depending upon the assigned sense of said corresponding set of input signals; and output means associated with said logic circuit for producing an output signal manifestation once during each cycle of commutation through all of said logic states, whereby the periods between successive output signal manifestations vary dynamically and substantially in proportion to changes in the algebraic sum of the changeable input numbers.

15. A signal conversion circuit according to claim 14, further including a source of clock pulses for continuously driving said counter at a frequency which is several orders of magnitude in excess of the nominal rate at which said digital input signals change.

16. A signal conversion circuit comprising a source of clock pulses at a fixed high frequency;

a multi-stage binary counter driven by said clock pulses and adapted for sequentially stepping to the next lower count upon the occurrence of each of said pulses;

gating means having a. a plurality of sets of input lines for simultaneously receiving a corresponding plurality of sets of binary coded input signals, the set of input lines for each set of input signals having a corresponding index, b. controlled terminals connected to each stage of said counter for selectively presetting said counter to the count state then represented by a selected one of said sets of input signals, and c. control terminals for receiving a changeable gating signal which may represent the index for any set of input signals and for controlling the transfer of the selected set of input signals, which corresponds to the represented index, to said controlled terminals;

commutating means for generating said changeable gating signal and having means coupled to said counter to cyclically change said gating signal from a representation of one index to the next each time said counter reaches its minimum count; and and output terminal associated with said commutating means for supplying an output signal manifestation once during each full cycle of said commutating means, whereby successive output manifestations occur at intervals which vary substantially linearly with changes in the sum of said binary coded input signals.

17. A signal conversion circuit comprising means for simultaneously receiving a plurality of sets of changeable binary coded input signals;

a multi-stage up-down binary counter;

a source of high frequency clock pulses selectively connected to drive said counter in an up-count or down-count direction;

gating means having a. a plurality of sets of input lines for simultaneously receiving corresponding ones of said plurality of sets of input signals, the input lines for each input signal having a corresponding index, b. controlled terminals connected to each stage of said counter for selectively presetting said counter to the count state represented by a selected one of said sets of said input signals, and c. control terminals for receiving a changeable gating signal which may represent the index for any set of input signals and for effecting the transfer of that set of input signals, which corresponds to the represented index, to said controlled terminals; and commutating means coupled to said counter and responsive to the achievement of both the maximum and minimum counts in said counter for presetting said counter to the count state represented by the prevailing set of input signals at said controlled terminals and for changing said gating signal from a representation of one index to the next, said commutating means further being operative to initiate counting in a direction corresponding to the assigned sense of said prevailing set of input signals; and means including an output terminal associated with said commutating means for supplying an output signal manifestation once during each full cycle of said commutating means, whereby successive output manifestations occur at intervals which vary substantially linearly with changes in the algebraic sum of said input signals.

* * * * *